United States Patent

Botti et al.

Patent Number: 5,663,681
Date of Patent: Sep. 2, 1997

[54] APPARATUS AND METHOD FOR STABILIZING AN AMPLIFIER

[75] Inventors: Edoardo Botti, Vigevano; Giorgio Chiozzi, Cinisello Balsamo, both of Italy

[73] Assignee: SGS-Thomson Microelectronics S.r.l., Agrate Brianza, Italy

[21] Appl. No.: 423,565

[22] Filed: Apr. 14, 1995

[30] Foreign Application Priority Data

Apr. 15, 1994 [EP] European Pat. Off. ............. 94830179

[51] Int. Cl.⁶ .................................................. H03F 1/26
[52] U.S. Cl. ........................... 330/51; 330/297; 381/120
[58] Field of Search .................. 330/51, 297; 381/94, 381/120, 121; 455/223

[56] References Cited

U.S. PATENT DOCUMENTS

| | | | |
|---|---|---|---|
| 4,433,306 | 2/1984 | Honda et al. | 330/297 |
| 4,638,507 | 1/1987 | Palara et al. | 381/120 X |
| 4,956,616 | 9/1990 | Botti | 330/297 |
| 5,166,983 | 11/1992 | Susak | 381/104 |
| 5,199,079 | 3/1993 | Anderson et al. | 330/51 X |
| 5,363,062 | 11/1994 | Nebuloni et al. | 330/51 X |

FOREIGN PATENT DOCUMENTS

| | | | |
|---|---|---|---|
| 0 185 411 | 6/1986 | European Pat. Off. | H03F 3/72 |
| 0 299 665 | 1/1989 | European Pat. Off. | H03F 1/30 |
| 5014061 | 1/1993 | Japan | H03F 1/00 |

*Primary Examiner*—James B. Mullins
*Attorney, Agent, or Firm*—David V. Carlson; Bryan A. Santarelli; Seed and Berry LLP

[57] ABSTRACT

A low frequency amplifier comprising, in series, a first input stage, an intermediate amplifying stage and a final stage. The intermediate amplifying stage comprises a capacitor which is discharged when the amplifier is disabled, and is charged to a predetermined bias value when the amplifier is operative. To prevent voltage peaks at the output of the amplifier during the transient interval between the disabled and operating condition of the amplifier, a second input stage is provided which is only turned on during the transient interval, and is connected to the capacitor to detect its voltage and charge it. During the transient interval, the final stage is disabled. Upon the capacitor reaching the predetermined charge value, the second input stage practically turns itself off, and is then disabled; and, at the same time, the first input stage and the final stage are enabled to turn on the amplifier.

15 Claims, 3 Drawing Sheets

APPARATUS AND METHOD FOR STABILIZING AN AMPLIFIER

TECHNICAL FIELD

The present invention relates to a low frequency amplifier, in particular a high quality audio amplifier having a split supply that is symmetrical with respect to ground, and having a load connected directly between the amplifier output and ground and no decoupling capacitor.

BACKGROUND OF THE INVENTION

As is known, at present, amplifiers of the above type perform a standby function wherein the amplifier is supplied with power but the current paths are interrupted as much as possible to minimize (theoretically eliminate) absorption; in that condition, any signals at the input are not transferred to the output of the amplifier.

For clarity, a typical existing audio amplifier of the above type is described with reference to the block diagram in FIG. 1.

The FIG. 1 amplifier, indicated by reference numeral 1, is substantially composed of three cascade stages: an input stage 2; a voltage amplifying stage 3; and an output stage 4 operating as a current amplifier.

Input stage 2 comprises a transconductance amplifier Gm1, i.e., an amplifier with a voltage input and a current output, and presents a noninverting input connected to an input terminal 5 that is supplied with an input signal $V_{IN}$ to be amplified. An input resistor 6 is also provided between terminal 5 and ground. Input stage 2 also presents an inverting input connected to a feedback line 7, and is connected to a first supply line 10 (at voltage $V_{CC}$) via a first switch 11 controlled by a logic signal S1.

Voltage amplifying stage 3 is exemplified by a transistor 14, here a bipolar NPN type, with the base terminal connected to the output of input stage 2 at node 12, the emitter terminal connected to a second supply terminal 15 at voltage $-V_{CC}$, and the collector terminal connected at node 13 to a current source 16, which is also connected to first supply line 10 via a second switch 17, which is also controlled by signal S1. A compensating capacitor 18 is provided between the collector and base terminals of transistor 14.

Output stage 4 substantially operates as a buffer, and presents an input connected to the collector terminal of transistor 14 at node 13, and an output 19 defining the output of amplifier 1 and connected directly to one terminal of a load 20, represented here by a resistor that is grounded at its other terminal. The voltage across load 20 is $V_O$. Output stage 4 is connected to first supply line 10 via a third switch 21 controlled by the same logic signal S1 as switches 11 and 17, so that, when switch 21 is open, output stage 4 is turned off and disconnects the load from the rest of amplifier 1.

Feedback line 7 comprises a block 22 having a transfer function $\beta$ and connected between output 19 of amplifier 1 and the inverting input of input stage 2.

When the FIG. 1 amplifier is in standby mode, logic signal S1 assumes a level (indicated "logic 0" in FIG. 2) corresponding to the open condition of switches 11, 17 and 21, so that stages 2, 3 and 4 are disconnected from the positive supply; voltage $V_1$ with respect to ground at the base terminal and voltage $V_2$ at the collector terminal of transistor 14 are equal $V_1=V_2=-V_{CC}$, i.e., equal the negative supply voltage of line 15; capacitor 18 is discharged; and output voltage $V_O$ is zero (FIG. 2).

When amplifier 1 is turned on, logic signal S1 switches to a logic state ("1" in FIG. 2) such as to close switches 11, 17, 21, so that stages 2–4 are turned on, and amplifier 1 evolves towards the balanced bias condition (steady state). More specifically, in the transient interval, capacitor 18 is charged from 0 V to $V_{CC}$ so that voltage $V_2$ is brought from $-V_{CC}$ to 0 V; and voltage $V_O$ at the load follows voltage $V_2$ at the input of the final stage, so that, when switch 21 is closed and final stage 4 turned on, it presents a negative peak of approximately $-V_{CC}$ followed by an increase up to the steady-state value of approximately 0 volts, as shown in FIG. 2.

To eliminate the negative peak, nodes 12 and 13 may be appropriately biased by connecting them to voltage sources each of a predetermined value, where these voltage sources are only active in the transient interval from standby mode. Such a solution, however, is difficult to implement in that, for it to function properly, the values of the voltages supplied depend upon the specific circuit involved and are highly unpredictable, especially as regards voltage $V_1$ at node 12.

Neither is it possible to simply keep final stage 4 off during the transient interval, as this would not guarantee circuit 1 reaching the steady-state condition. If in fact, stage 4 were kept off during the transient interval, input stage 2 would be unaware of developments in the circuit via feedback branch 7 by virtue of node 13 being disconnected from node 19 to which input stage 2 is connected.

SUMMARY OF THE INVENTION

It is an object of the present invention to provide a low frequency amplifier designed to overcome the problem of the negative peak in the output voltage.

In accordance with one aspect of the present invention, a circuit is provided for stabilizing an amplifier during transient interval. The amplifier includes a node in communication with an output stage. A charging circuit charges the node to an operating voltage during the transient interval. An enable/disable circuit enables the charging circuit and disables the output stage during the transient interval such that no transient voltages appear at the amplifier output during the transient period. In a related aspect of the invention, the transient period is the start-up period of the amplifier.

In another aspect of the invention, the charging circuit senses the voltage at the node and stops charging the node when the node voltage is substantially equal to the operating voltage. In a related aspect of the invention, the charging circuit includes a differential input circuit having a first terminal that receives a reference voltage and a second terminal that receives the voltage at the node. The charging circuit compares these voltages and stops charging the node when the node voltage becomes substantially equal to the reference voltage, which, in one aspect of the invention, is substantially equal to the operating voltage.

In still another aspect of the invention, the enable/disable circuit includes a switching circuit that couples the charging circuit to and decouples the output stage from a power-supply terminal during the transient interval. The enable/disable circuit may also decouple the charging circuit from and couple the output stage to the power supply terminal during an operating interval that begins at or after the end of the transient interval.

BRIEF DESCRIPTION OF THE DRAWINGS

A non-limiting embodiment of the present invention will be described by way of example, with reference to the accompanying drawings, in which.

DETAILED DESCRIPTION OF THE INVENTION

Figure 1:
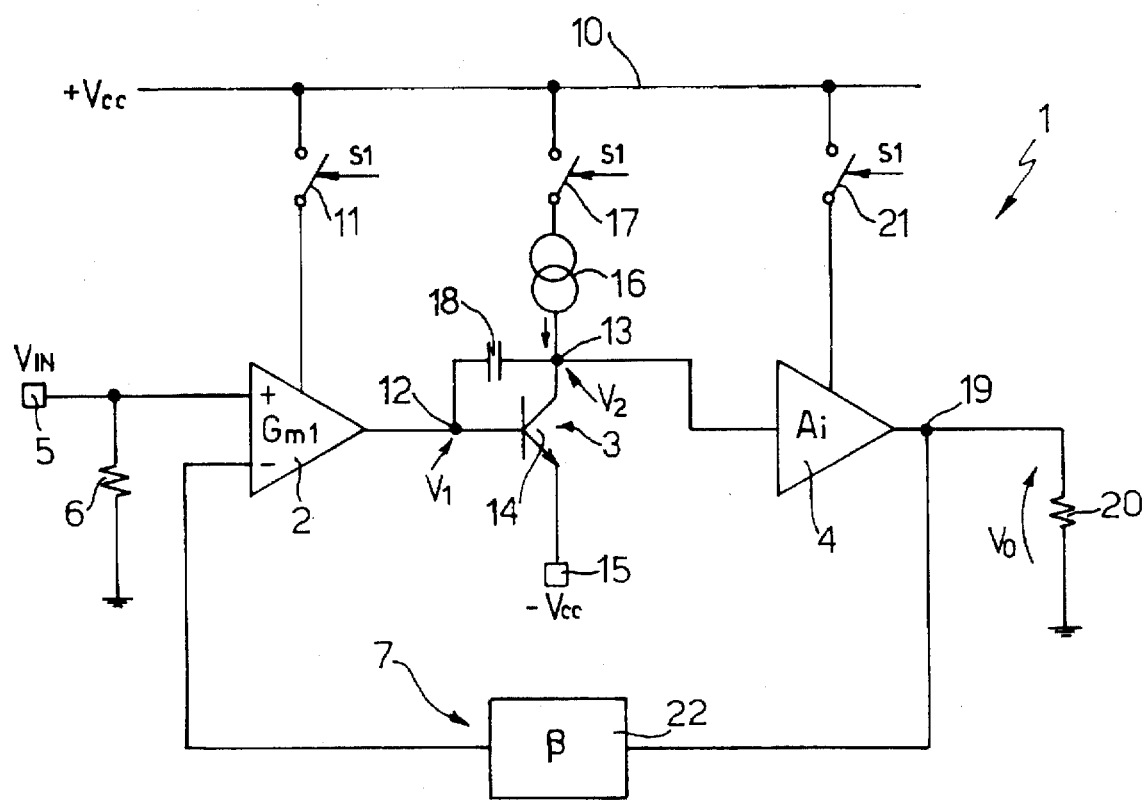
FIG. 1 shows a block diagram of a typical prior-art amplifier of the type considered.
Figure 2:
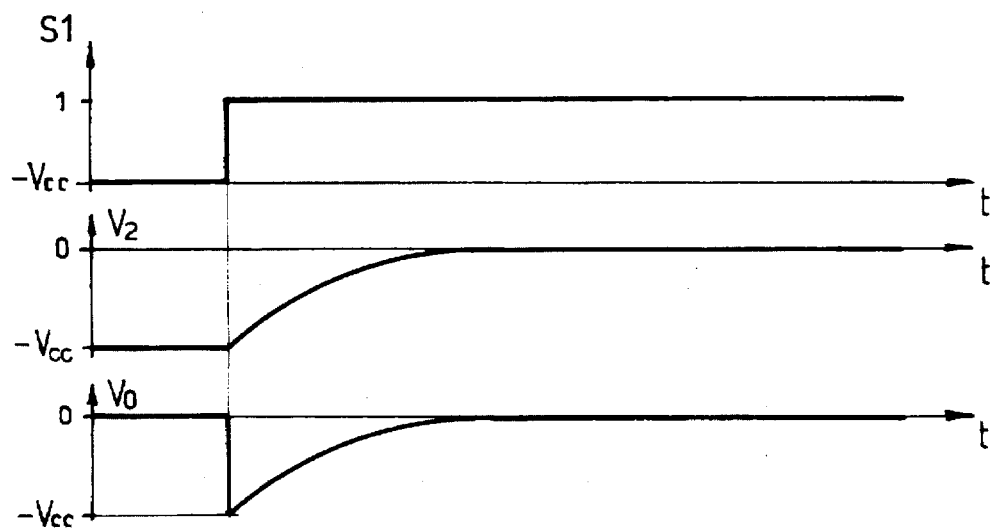
FIG. 2 shows a time diagram of a number of signals relative to the FIG. 1 amplifier.
Figure 3:
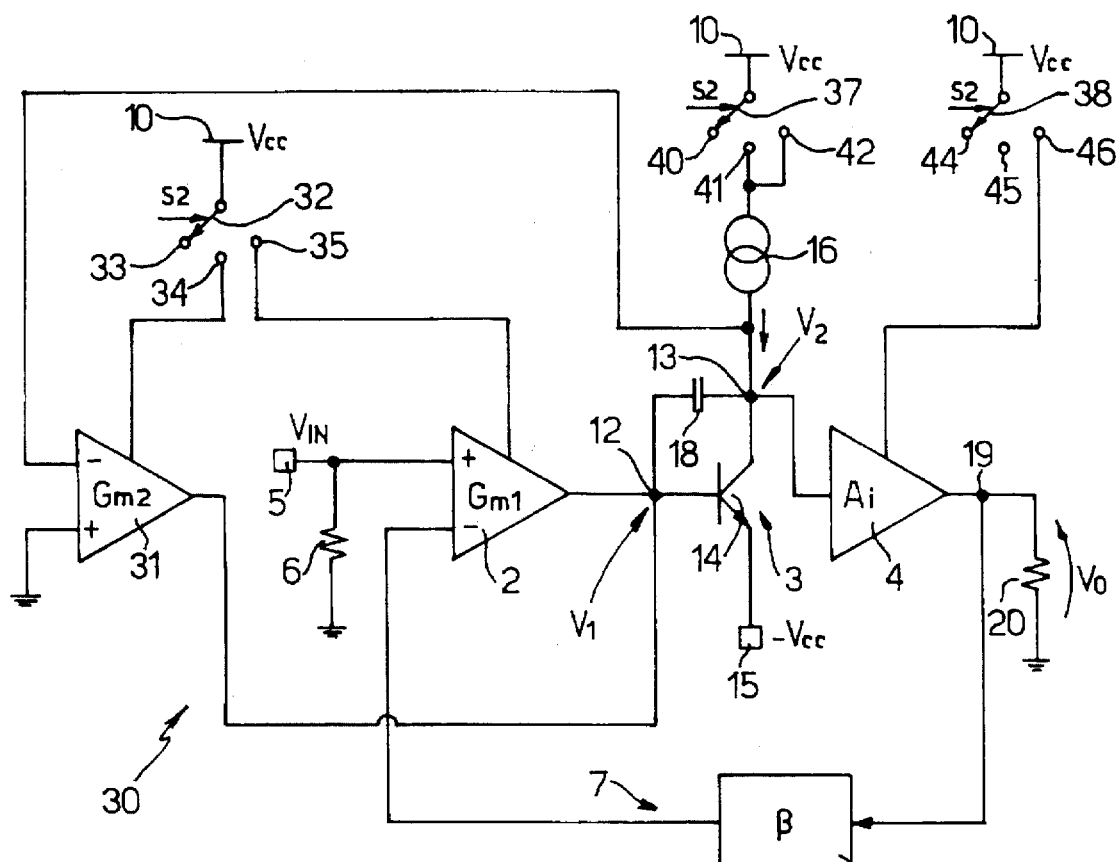
FIG. 3 shows a block diagram of an amplifier according to one aspect of the present invention.

Number 30 in FIG. 3 indicates a low frequency amplifier structure, wherein any parts common to amplifier 1 in FIG. 1 are indicated with same reference and with no detailed description.

As shown in FIG. 3, circuit 30 comprises a second input stage 31 (i.e., a transient input stage) formed by a transconductance amplifier Gm2, and presenting a grounded noninverting input, an inverting input coupled to node 13, and an output coupled to node 12. Input stages 2 and 31 are connected to $V_{CC}$ supply line 10 via a three-position switch 32 controlled by a signal S2. More specifically, in a first position (shown in FIG. 3), switch 32 connects supply line 10 to a node 33 not coupled to any point in circuit 30; in a second position, it connects supply line 10 to a node 34 connected to second input stage 31; and in a third position, it connects line 10 to a node 35 connected to first input stage 2.

Similarly, voltage amplifying stage 3 and output stage 4 are connected to supply line 10 via respective three-position switches 37 and 38 also controlled by signal S2. More specifically, switch 37 is movable between a first position (shown in FIG. 3) wherein it connects supply line 10 to an uncoupled node 40, and a second and third position wherein it connects supply line 10 to nodes 41, 42, both connected to node 13 via current source 16. Switch 38 is movable between a first and second position wherein it connects supply line 10 to uncoupled nodes 44 and 45, and a third position wherein it connects line 10 to a node 46 connected to output stage 4.

Figure 4:
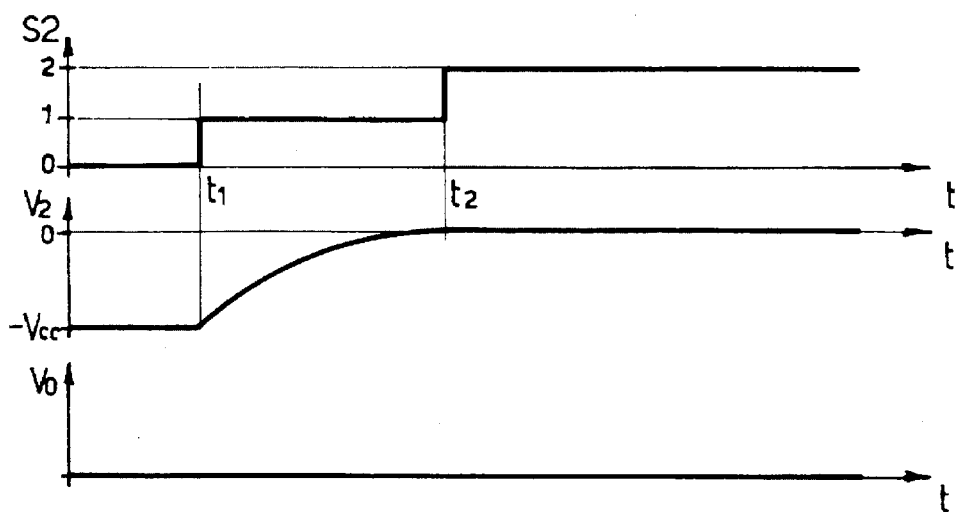
FIG. 4 shows a time diagram of a number of signals relative to the FIG. 3 amplifier.

Operation of the FIG. 3 circuit is now described with reference also to the signal diagram in FIG. 4. In the signal S2 plot, "0," "1" and "2," respectively, indicate a first, second and third value of signal S2, corresponding respectively to the first, second and third position of switches 32, 37, 38.

In standby mode, signal S2 presents a "0" value corresponding to the first position of switches 32, 37, 38, i.e., the position shown in FIG. 3, in which case, none of stages 2–4 is supplied with power from $V_{CC}$; voltage $V_0$ at the load is zero (0 V); and voltages $V_1$ and $V_2$ at nodes 12 and 13 are at $-V_{CC}$.

At time t1, signal S2 switches to "1" corresponding to the second position of switches 32, 37, 38. Consequently, switch 32 connects supply line 10 to node 34, so that second input stage 31 is supplied with $V_{CC}$, and first input stage 2 remains off; switch 37 connects line 10 to node 41, so that voltage amplifying stage 3 is supplied with $V_{CC}$; and switch 38 connects line 10 to node 45, so that output stage 4 remains unsupplied.

At this phase, therefore, output stage 4 continues operating like an open switch, and node 13 remains disconnected from output node 19; whereas second input stage 31 is turned on, and compares the voltages at its inputs. More specifically, and in known manner, stage 31 drives node 12 so as to reduce the unbalance between its inverting input (connected to node 13) and its (grounded) noninverting input; for which purpose, it draws current from the supply via source 16 and capacitor 18, which current charges capacitor 18, thus increasing voltage $V_2$ at node 13. This continues until voltage $V_2$ reaches 0 V (balanced condition of the inputs of stage 31) as shown in FIG. 4, after which, second input stage 31 practically turns itself off, leaving the circuit in the balanced condition achieved.

At time t2, signal S2 again switches, this time to value "2," so that switches 32, 37, 38 are set to the third position wherein switch 32 connects supply line 10 to node 35, thus cutting off supply to second input stage 31 and supplying first input stage 2 with $V_{CC}$; switch 37 connects line 10 to node 42 so that voltage amplifying stage 3 remains supplied with $V_{CC}$; and switch 38 connects line 10 to node 46, thus supplying output stage 4 with $V_{CC}$. As such, circuit 30 is now operative with stages 2–4 supplied with $V_{CC}$ and thus enabled and stage 31 uncoupled from $V_{CC}$ and thus disabled.

In other words, in the transient interval, the final stage 4 is turned off to prevent the signal transients from reaching the output, and, at the same time, input stage 2 is replaced by a stage (amplifier 31) for bringing the circuit into the balanced condition by charging compensating capacitor 18 to the required value, so that no negative pulses occur at the output, and the circuit is brought automatically into the steady-state condition. Conversely, in one aspect of the invention, in steady-state mode, second input stage 31 is turned off, and circuit 30 is similar, in terms of structure and operation, to the known circuit of FIG. 1.

Figure 5:
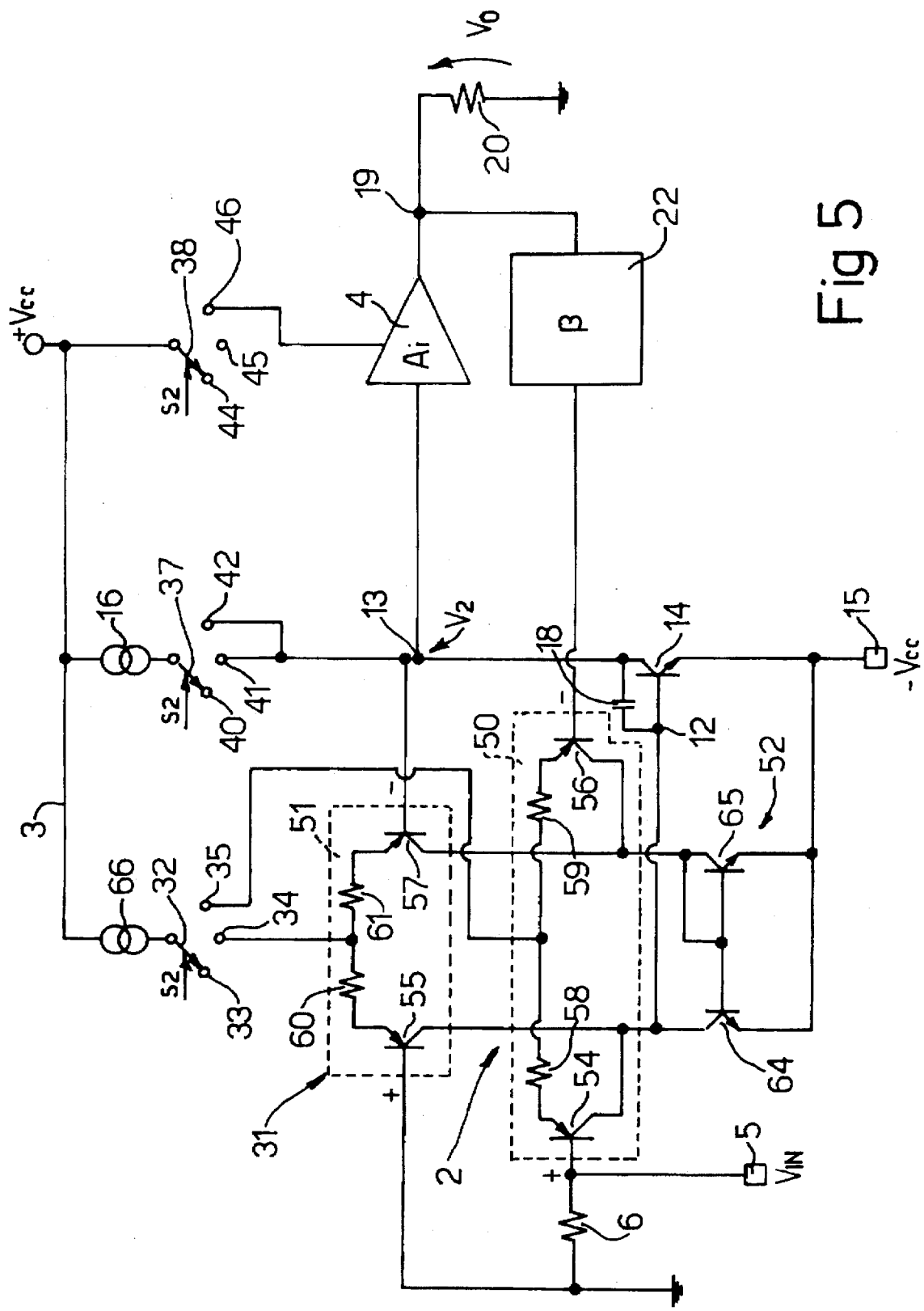
FIG. 5 shows one embodiment of the circuitry of the FIG. 3 amplifier according to the present invention.

FIG. 5 shows one embodiment of a circuit arrangement for implementing input stages 2 and 31 as shown in FIG. 3.

More specifically, in the FIG. 5 arrangement, stages 2 and 31 each present a respective differential circuit 50 and 51, and a common single-output load circuit 52. Differential circuits 50 and 51 are of known type, and each comprise a first transistor 54 and 55, and a second transistor 56 and 57, all PNP types. The emitter terminals of transistors 54 and 56 are connected to each other via respective resistors 58 and 59 and to node 35; the emitter terminals of transistors 55 and 57 are connected to each other via respective resistors 60 and 61 and to node 34; the base terminals of transistors 54 and 56 define the inputs of differential circuit 50, and are therefore connected respectively to input node 5 and feedback block 22; the base terminals of transistors 55 and 57 define the inputs of differential circuit 51, and are respectively grounded and connected to node 13; the collector terminals of transistors 54 and 55 are connected to the collector terminal of a transistor 64 forming part of common load circuit 52; and the collector terminals of transistors 56 and 57 are connected to the collector terminal of a transistor 65 also forming part of common load circuit 52.

Load transistors 64 and 65 are NPN types, with the base terminals connected to each other, and the emitter terminals both connected to node 15 supplying negative supply voltage $-V_{CC}$. Transistor 65 is diode-connected; and the collector terminal of transistor 64 defines the output of load circuit 52, which is connected to node 12. FIG. 5 also shows a current source 66 for biasing input stages 2 and 31.

The FIG. 5 circuit operates in the same way as described for circuit 30 in FIG. 3.

The FIG. 5 circuit presents the advantage of compactness by virtue of stages 2 and 31 sharing load circuit 52 and bias source 66. What is more, the circuit provides for a high degree of reliability by virtue of second input stage 31 being turned off in steady-state mode, and by virtue of requiring no alteration of stages 2–4 with respect to known amplifiers.

Clearly, changes may be made to the amplifier as described and illustrated herein without, however, departing from the scope of the present invention. In particular, the same inventive idea may also be applied to amplifiers featuring a voltage amplifying stage in the form of a MOS transistor requiring charging of the gate capacitance in the turn-on transient interval without producing a voltage peak at the output. Also, switches 32, 37, 38 may be formed in any appropriate manner, each by means of one or more switching elements appropriately controlled by one or more, e.g., digital, signals.

We claim:

1. A low frequency amplifier comprising, in series, an input stage, an intermediate amplifying stage and a final stage, wherein said intermediate amplifying stage comprises a capacitive element chargeable between a first value when said amplifier is disabled, and a second value when said amplifier is operative; characterized in that it comprises switchable source means connected to said capacitive element, for supplying said capacitive element with a charge signal; enabling means for enabling said source means during a transient interval between a disabled condition and an operating condition of said amplifier; and disabling means for disabling said final stage during said transient interval.

2. An amplifier as claimed in claim 1, characterized in that said source means comprise voltage comparing means connected to said capacitive element, for disabling said source means upon said second charge value of said capacitive element being reached.

3. An amplifier as claimed in claim 1, characterized in that said enabling means comprise a first switch element; said first switch element being connected to a first reference potential line, to said input stage, and to said source means, and selectively connecting said input stage or said source means to said first reference potential line.

4. An amplifier as claimed in claim 1 wherein said input stage comprises a first transconductance amplifying stage; characterized in that said source means comprise a second transconductance amplifying stage.

5. An amplifier as claimed in claim 4 wherein said capacitive element presents a first terminal connected to the input node of said final stage, and a second terminal connected to the output node of said input stage; characterized in that said second transconductance amplifying stage comprises a first input connected to said first terminal of said capacitive element; a second input connected to a first reference potential line; and an output connected to said second terminal of said capacitive element.

6. An amplifier as claimed in claim 5, of the split supply type, comprising a second and a third reference potential line; said first reference potential line defining a ground line; and said second and third reference potential lines presenting a potential of the same value and opposite sign with respect to said ground line; characterized in that said second input of said second transconductance amplifying stage is connected to said ground line.

7. An amplifier as claimed in claim 4, characterized in that said first and second transconductance amplifying stages each comprise a respective differential circuit; a common single-output load circuit; and a common bias source element.

8. An amplifier as claimed in claim 1, characterized in that said disabling means comprise a switch element connected between a reference potential line and said final stage, said switch element connecting said final stage to said reference potential line at the end of said transient interval.

9. An amplifier, comprising:
an input stage having a first output terminal and a first supply terminal;
an amplifying stage having a first input terminal coupled to said first output terminal, a capacitive element having first and second terminals, and a second output terminal;
an output stage having a second input terminal coupled to said second output terminal, a second supply terminal and a third output terminal;
a charging circuit having a first input terminal operable to receive a reference voltage, a second input terminal coupled to said second output terminal, a third supply terminal, and a fourth output terminal coupled to one of said terminals of said capacitive element, said charging circuit operable to charge said capacitive element to an operating voltage during a transient interval until the voltage at said second output terminal is substantially equal to said reference voltage; and
an enable/disable circuit operable to enable said charging circuit and said amplifying stage and to disable said input and output stages during said transient interval.

10. The circuit of claim 9 wherein said reference voltage is substantially equal to said operating voltage.

11. An amplifier, comprising:
an input stage having a first output terminal and a first supply terminal;
an amplifying stage having a first input terminal coupled to said first output terminal, a capacitive element having first and second terminals, and a second output terminal;
an output stage having a second input terminal coupled to said second output terminal, a second supply terminal, and a third output terminal;
a charging circuit having a third supply terminal, and a fourth output terminal coupled to one of said terminals of said capacitive element, said circuit operable to charge said capacitive element to an operating voltage during a transient interval; and
an enable/disable circuit operable to enable said charging circuit and said amplifying stage and to disable said input and output stages during said transient interval, said enable/disable circuit including,
a first switch operable to couple said third supply terminal to and uncouple said first supply terminal from a power-supply line during said transient interval, and to uncouple said third supply terminal from and couple said first supply terminal to said power-supply line during an operating interval that begins at the end of said transient interval, and
a second switch operable to uncouple and couple said second supply terminal from and to said power-supply line during said transient and operating intervals.

12. An amplifier, comprising:
an input stage having a first output terminal and a first supply terminal;
an amplifying stage having a first input terminal coupled to said first output terminal, a capacitor having first and second terminals, and a second output terminal coupled to said first terminal of said capacitor, said second terminal of said capacitor coupled to said first input terminal;
an output stage having a second input terminal coupled to said second output terminal, a second supply terminal, and a third output terminal;

a charging circuit having a third supply terminal, and having a fourth output terminal coupled to said first input terminal, said charging circuit operable to charge said capacitor to an operating voltage during a transient interval; and an enable/disable circuit operable to enable said charging circuit and said amplifying stage and to disable said input and output stages during said transient interval.

13. An amplifier, comprising:

an input stage having a first output terminal and a first supply terminal;

an amplifying stage having a first input terminal coupled to said first output terminal, a capacitive element having first and second terminals, and a second output terminal;

an output stage having a second input terminal coupled to said second output terminal, a second supply terminal, and a third output terminal;

a charging circuit having a third supply terminal, and a fourth output terminal coupled to one of said terminals of said capacitive element, said circuit operable to charge said capacitive element to an operating voltage during a transient interval;

said input stage and said charging circuit including, respective differential input circuits,
a common single-output load circuit operable to drive said second input terminal, and
a common bias circuit; and an enable/disable circuit operable to enable said charging circuit and said amplifying stage and to disable said input and output stages during said transient interval.

14. A method for initializing an amplifier, the method comprising:

disabling an input stage and an output stage of said amplifier;

enabling an intermediate stage of said amplifier, said intermediate stage having an input node coupled to said input stage and having an output node coupled to said output stage;

comparing a voltage at said output node with a reference voltage;

charging a capacitor that is coupled between said input and output nodes until said voltage at said output node is substantially equal to said reference voltage; and enabling said input and output stages when said voltage at said output node is substantially equal to said reference voltage.

15. The method of claim 14 wherein:

said disabling comprises uncoupling said input and output stages from a power supply; and said enabling said input and output stages comprises coupling said input and output stages to said power supply.

* * * * *